US 6,493,221 B2

(12) United States Patent
Harrison et al.

(10) Patent No.: US 6,493,221 B2
(45) Date of Patent: *Dec. 10, 2002

(54) COMPUTER PERIPHERAL BAY COOLING APPARATUS

(75) Inventors: Joe A. Harrison, Olympia, WA (US); Scott M. Deane, Olympia, WA (US)

(73) Assignee: Intel Corporation, Santa Clara, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/073,300

(22) Filed: May 5, 1998

(65) Prior Publication Data

US 2001/0043460 A1 Nov. 22, 2001

(51) Int. Cl.⁷ .............................. G06F 1/20; H05K 7/20
(52) U.S. Cl. .................... 361/687; 361/695; 454/184
(58) Field of Search ................................ 361/685, 687, 361/695, 697, 717–719; 454/184; 312/286

(56) References Cited

U.S. PATENT DOCUMENTS

| 4,147,299 | A | * | 4/1979  | Freeman ............... 361/695 |
| 5,171,183 | A | * | 12/1992 | Pollard et al. ......... 361/685 |
| 5,287,244 | A | * | 2/1994  | Hileman et al. ........ 361/687 |
| 5,493,474 | A | * | 2/1996  | Schkrohowksy et al. ... 361/695 |
| 5,596,483 | A | * | 1/1997  | Wyler ................. 361/685 |
| 5,694,290 | A | * | 12/1997 | Chang ................. 361/685 |
| 5,706,668 | A | * | 1/1998  | Hilpert ............... 361/695 |
| 5,731,954 | A | * | 3/1998  | Cheon ................. 361/699 |
| 5,831,525 | A | * | 11/1998 | Harvey ................ 361/687 |
| 6,042,474 | A | * | 3/2000  | Harvey et al. ......... 454/184 |

* cited by examiner

Primary Examiner—Lynn D. Feild
(74) Attorney, Agent, or Firm—Blakely, Sokoloff, Taylor & Zafman LLP

(57) ABSTRACT

The computer peripheral bay cooling apparatus comprises a blower chassis adapted to fit within the 5¼ inch drive bay of a computer chassis and a blower enclosed within the blower chassis.

27 Claims, 6 Drawing Sheets

COMPUTER PERIPHERAL BAY COOLING APPARATUS

FIELD OF THE INVENTION

The present invention pertains to the field of computer peripherals. More particularly, the invention relates to a cooling apparatus for use in an enclosed computer system.

BACKGROUND

The speed of integrated circuits has grown at an exponential rate in recent years. This has resulted in an unprecedented surge in computing performance. Unfortunately, the use of faster and more powerful integrated circuits generally results in an increase in heat generation.

In addition to the integrated circuits required for computer operation (e.g., the microprocessor and disk drive controllers residing on the motherboard), computers today incorporate numerous additional integrated circuits though the use of add-in circuit cards. These add-in cards can be plugged directly into the expansion bus slots of the motherboard. Common expansion bus slots today include the Industry Standard Architecture (ISA) bus the Extended ISA (EISA) bus, and the high-speed PCI (Peripheral Component Interconnect) bus. It is not uncommon for a computer to have the majority of these expansion bus slots filled. For example, a typical personal computer will contain a 3D video card, a modem or network card, and a sound card. These additional components, while providing additional functionality, contribute to the electrical heat dissipation within the computer chassis and also take up significant amounts of space within the chassis.

Maintaining computer system components below certain temperature levels is important to ensure performance, reliability, and safety. Most integrated circuits have specified maximum operating temperatures above which the manufacturer does not recommend operation. Moreover, transistors, the building blocks of integrated circuits, tend to slow down as operating temperatures increase. In severe cases, integrated circuits may be physically damaged if temperatures elevate beyond those recommended. Such physical damage will clearly impact system performance. Accordingly, it is desirable to keep a computer system from operating its integrated circuits close to or beyond recommended temperatures.

Typically, heat sinks, fans, blowers, and heat pipes are employed to dissipate heat from integrated circuits and other electronic components. Increases in heat generation are often accompanied by increases in the quantity and size of the heat dissipation elements. However, the size of such elements is limited by the space available within a typical computer chassis. Moreover, the usefulness of such heat dissipation elements decreases if the ambient temperature surrounding the elements (i.e., the air temperature within the computer chassis) becomes too high.

DC brushless blower systems are therefore necessary to remove the heated air from the computer chassis (or, alternatively, to blow cool air into the chassis). For many years, a single DC brushless blower located within the power supply has been adequate for removing hot air from the computer chassis. However, as the speed of computer components increases, accompanied by an increase in heat dissipation, such a configuration will prove unworkable. Today, in more powerful computers (e.g., high powered file servers) which require additional cooling, an area of space within the computer chassis is specifically allocated for an additional fan or blower. Attaching the supplemental fan or blower to the computer chassis requires an interface on the computer chassis adapted specifically for the attachment of the fan or blower.

It would be advantageous to provide a blower package which would fit within a computer chassis without taking up a specifically allocated area of space within the computer chassis. Such an area would be better utilized to incorporate integrated circuit boards. It would also be advantageous to provide a cooling blower apparatus which could be attached to an interface common to most computer systems, thereby eliminating the need for a specialized interface.

SUMMARY

The computer peripheral bay cooling apparatus comprises a blower chassis adapted to fit within the 5¼ inch drive bay of a computer chassis and a blower enclosed within the blower chassis.

BRIEF DESCRIPTION OF THE DRAWINGS

A preferred embodiment of the present invention is described herein with reference to the drawings wherein.

DETAILED DESCRIPTION OF THE PREFERRED EMBODIMENT

Figure 1:
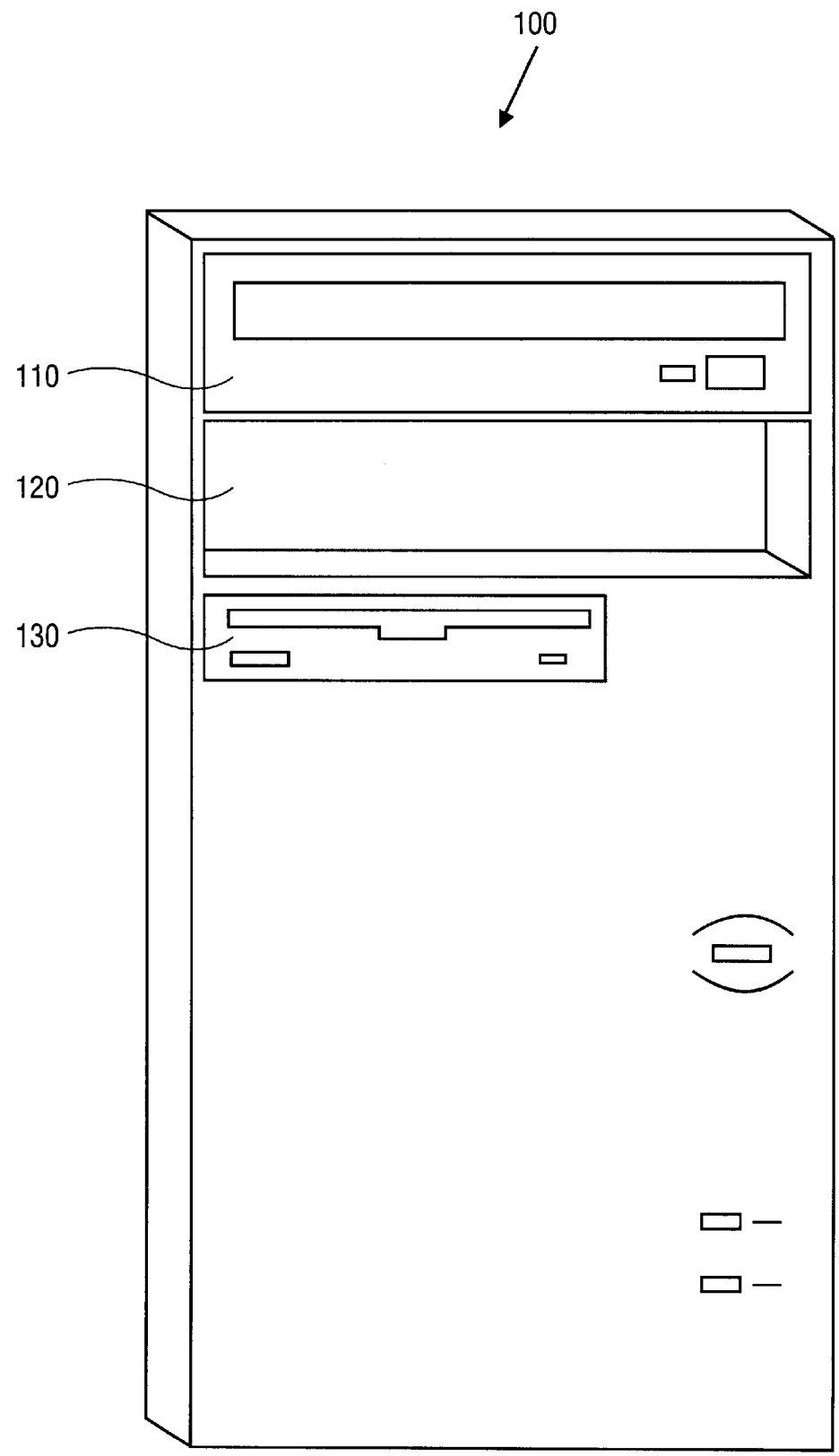
FIG. 1 is a perspective front view of a the drive bay configuration of a typical computer system.

FIGS. 1 though 9 of the drawings disclose various embodiments of the present invention for purposes of illustration only. One of ordinary skill in the art will readily recognize from the following discussion that alternative embodiments of the structures and methods illustrated herein may be employed without departing from the principles of the invention. The following description may include specific numbers and quantities associated with the device and methods described herein. In should be apparent to one skilled in the art that these numbers and quantities are used herein for illustrative purposes.

In FIG. 1 the drive bay configuration of a typical computer system 100 is illustrated (e.g., an ATX or NLX style personal computer). One of the 5¼ inch bays is occupied by a CD-ROM drive 110. The other 5¼ inch bay 120 is vacant. The 3½ inch drive bay is occupied by a 3½ inch floppy disk drive 130. This configuration is quite common today. Although the typical computer chassis is equipped with two or more 5¼ inch form factor drive bays, only one of those bays is generally filled—most often with a CD-ROM or DVD drive 110.

Figure 2:
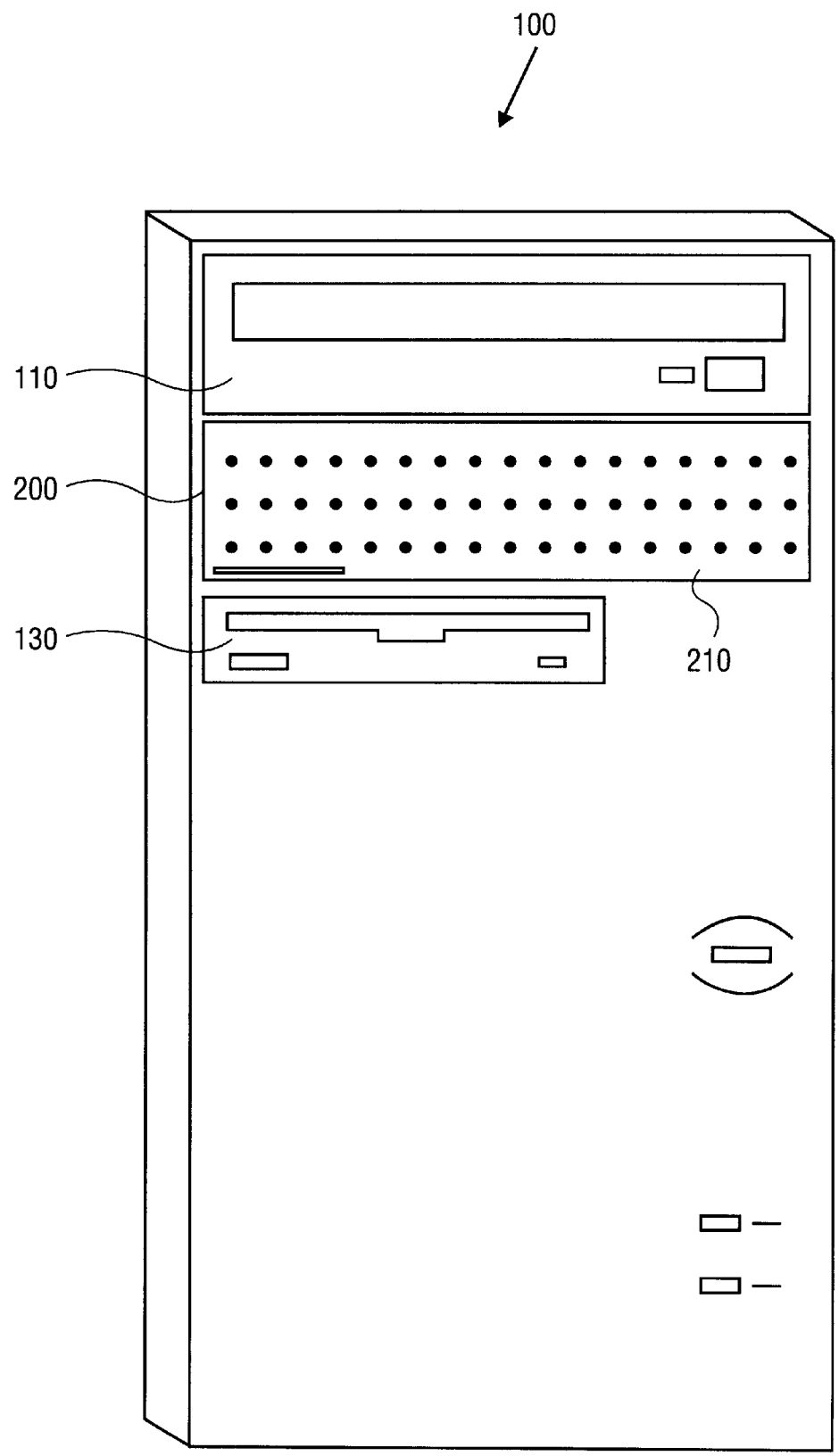
FIG. 2 is a perspective front view of the present invention installed in one of the 5¼ inch drive bays of a computer system.
Figure 3:
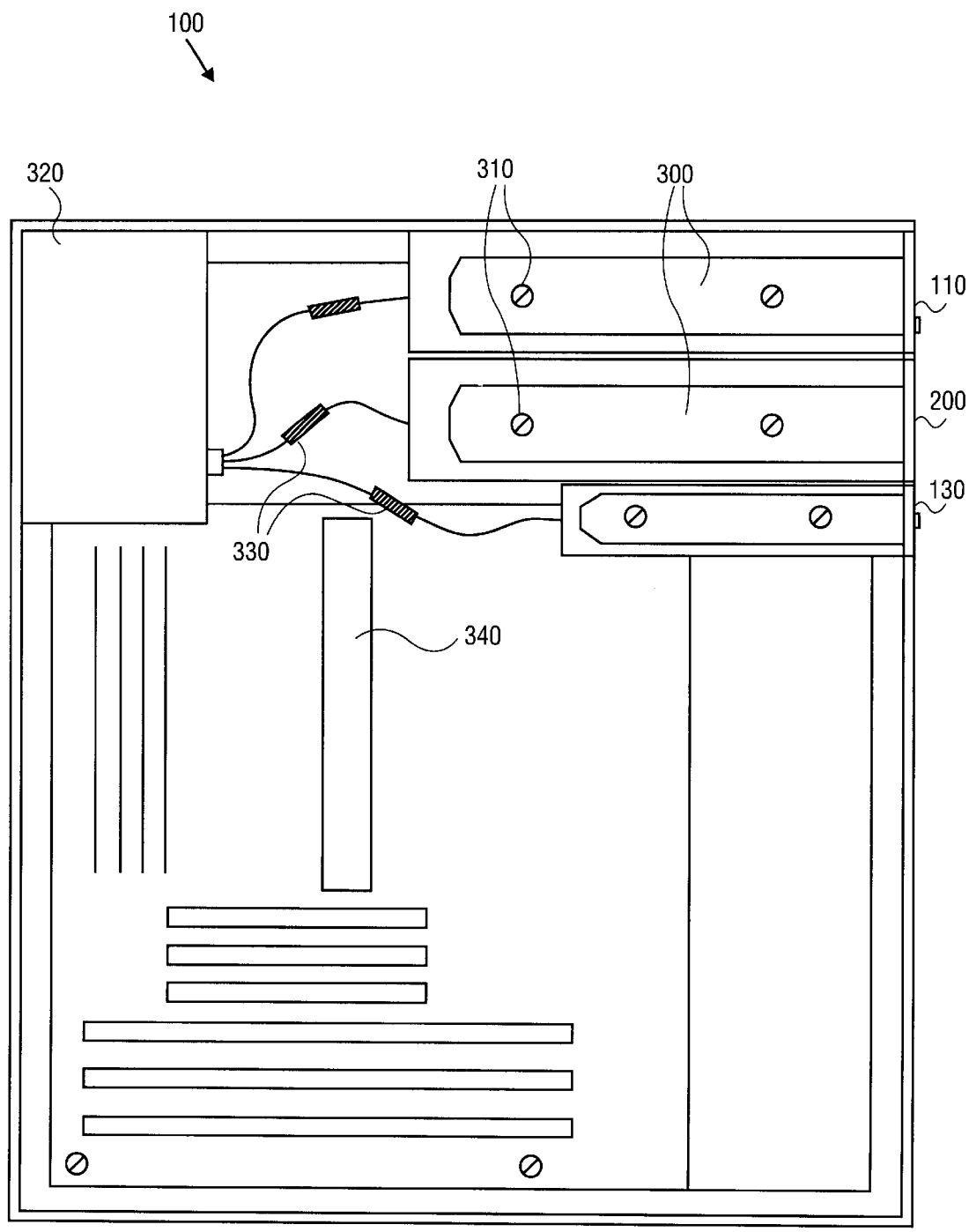
FIG. 3 is a perspective side view of the present invention installed in one of the 5¼ inch drive bay of a computer system

FIG. 2 illustrates a computer system 100 with the computer peripheral bay cooling apparatus 200 installed in the lower 5¼ inch drive bay 120. FIG. 3 illustrates the same computer system 100 from a side perspective. In a preferred embodiment, the computer peripheral bay cooling apparatus 200 can be installed without any additional hardware, using the standard brackets 300 and screws 310 already present in the computer system chassis (i.e., the same brackets 300 and screws 310 used to install CD-ROM or DVD drives or 5¼ inch floppy disk drives). The front panel 210 of the peripheral cooling apparatus 200 will commonly be made of plastic and can be color-matched to the color schemes of typical OEM computer cases.

Although FIGS. 1 through 3 illustrate the present invention in a "tower" personal computer configuration (i.e., a configuration where the motherboard is positioned in a substantially vertical plane within the computer chassis), one of ordinary skill in the art will recognize that the present invention can also be implemented in a "desktop" personal computer configuration (i.e., a configuration where the motherboard is positioned in a substantially horizontal plane within the computer chassis) as well.

The newer, higher powered central processing units 340 (including but not limited to the Pentium II™ line of processors using Single Edge Cartridge™ (SEC) design) are typically located in an area on the motherboard behind the 5¼ inch peripheral drive bays 120. Accordingly, because of its location within the computer chassis, the computer peripheral cooling apparatus 200 is able to provide cool air directly in the vicinity of the central processing unit 340. As such, it is a practical solution to the problem of increased heat dissipation from the microprocessor, especially because real estate within the computer chassis for an additional cooling apparatus is at a premium.

In a preferred embodiment, power for the peripheral cooling apparatus 200 is supplied from the system power supply 320 via the industry standard DC disk power connector 330. An example of this type of connector is the AMP Inc. soft shell connector, part number 1-480426-0. Using a power interface common to the personal computer industry will decrease manufacturing costs and simplify installation of the computer peripheral bay cooling apparatus.

Additionally, the blower 420 may be thermally controlled so as to increase air flow when more cooling is required and to decrease airflow when less cooling is required. This can be accomplished using either local or remote speed sensing circuitry. Using local circuitry (circuitry located within the blower chassis itself), thermal sensing elements (e.g., thermocouples) can be placed at various worst-case thermal locations within the computer chassis. When the temperature at a particular thermal location reaches a critical level, the optional speed sensing circuitry will signal the blower to increase its speed to provide additional cool air to integrated circuits within the computer chassis.

The computer peripheral drive bay cooling apparatus can also be controlled via the remote power management circuitry found in most new motherboards. The remote sensing circuitry will relay a signal to the computer peripheral bay cooling apparatus 200 to increase the speed of the blower 420 when additional cooling is required. Additionally, through the use of remote power management circuitry, the user will be prompted when the blower 420 is not working properly.

A partition 450, 650, and 850 is attached to the chassis of the computer peripheral cooling apparatus 200 to isolate the intake 400 and exhaust 410 of the apparatus 200. The partition 450, 650, and 850 helps to increase the static air pressure provided by the apparatus 200. Additionally, the partition 450, 650, 850 will prevent warm air from seeping through the spaces between the computer peripheral cooling apparatus 200 and the drive bay 120, and thereby re-circulating into the computer system 100. Additionally, acoustical foam can be inserted between the peripheral cooling apparatus 200 and the drive bay 120 into which it is encased. The acoustical foam will dampen any unwanted vibrations or noise.

Figure 4:
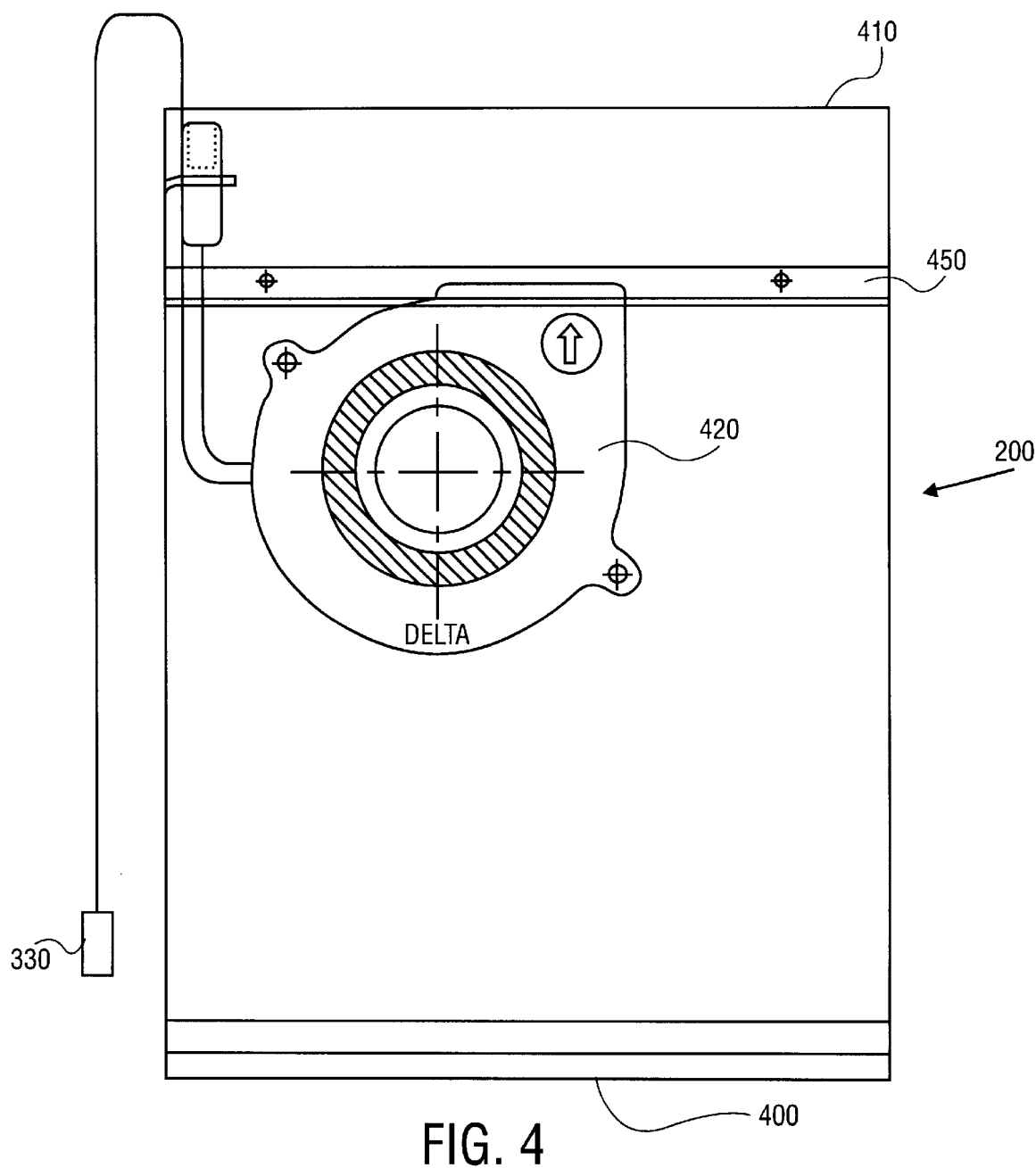
FIG. 4 is a perspective top view of the present invention with a single brushless DC blower.
Figure 5:
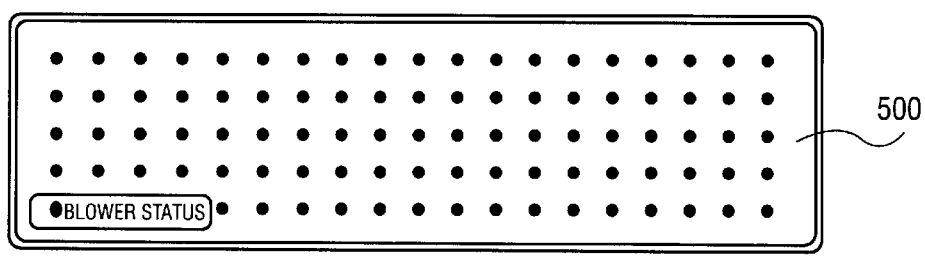
FIG. 5 is a perspective front view of the present invention with a single brushless DC blower.
Figure 6:
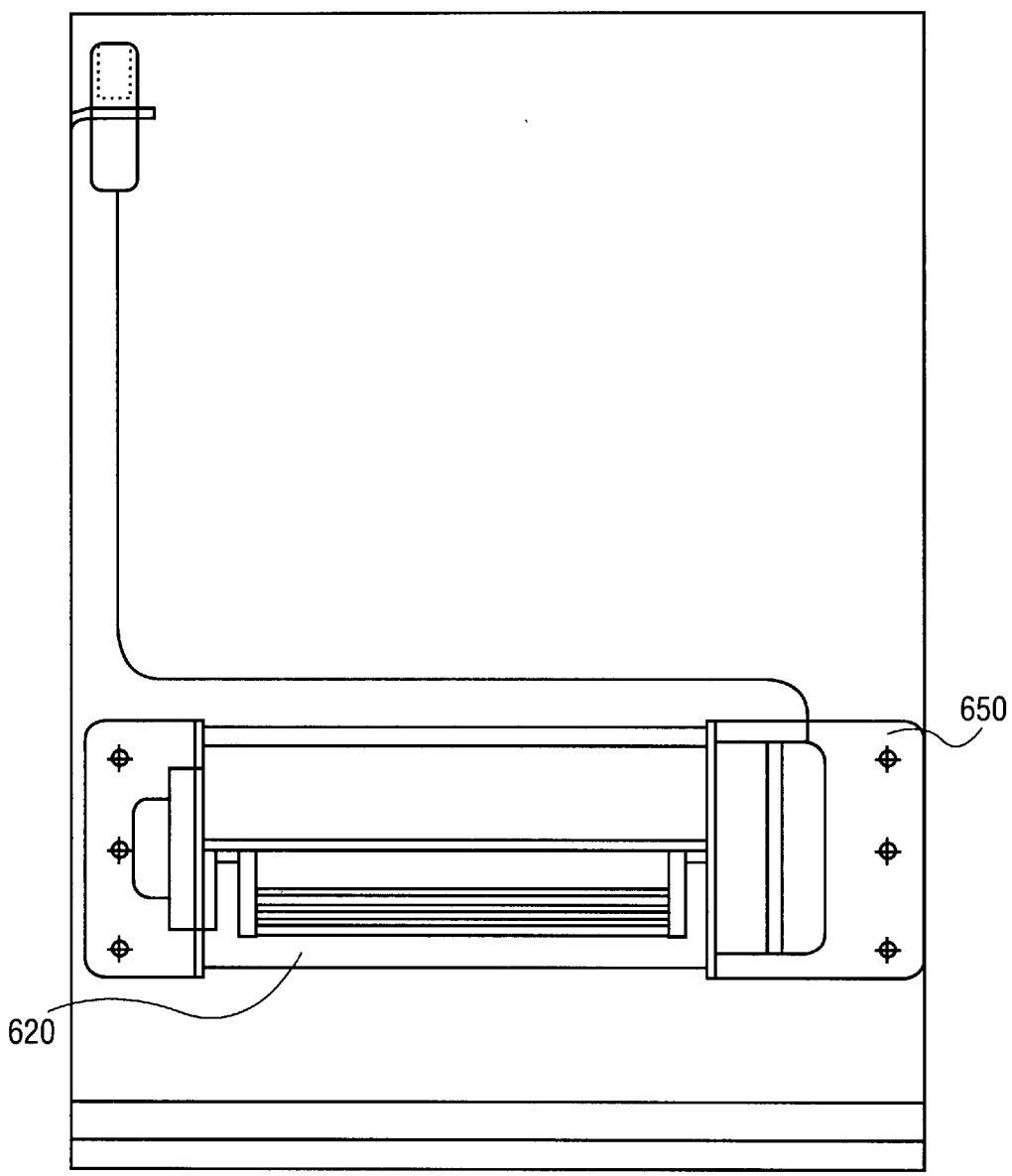
FIG. 6 is a perspective top view of the present invention with a single tangential crossflow blower.
Figure 7:
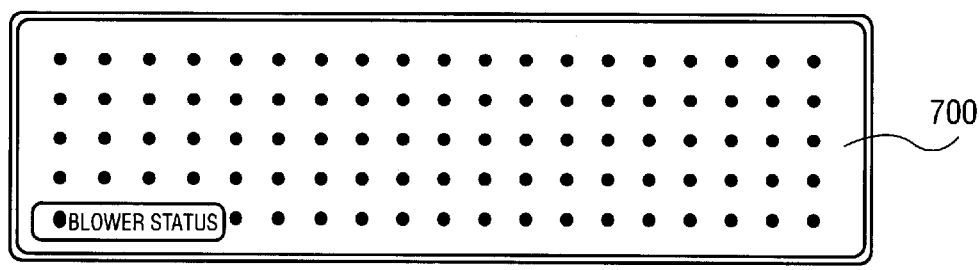
FIG. 7 is a perspective front view of the present invention with a single tangential crossflow blower.
Figure 8:
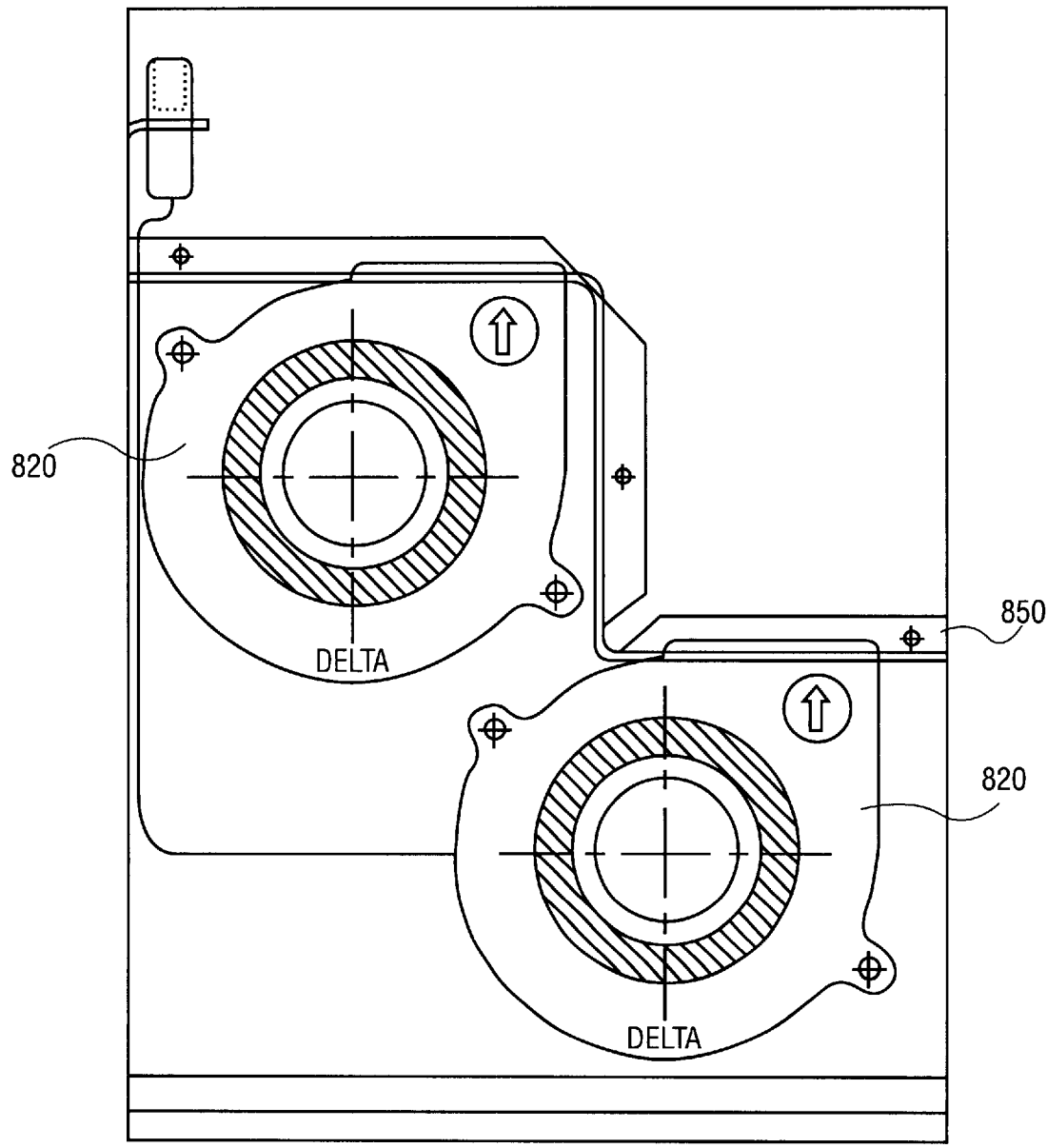
FIG. 8 is a perspective top view of the present invention with dual brushless DC blowers.
Figure 9:
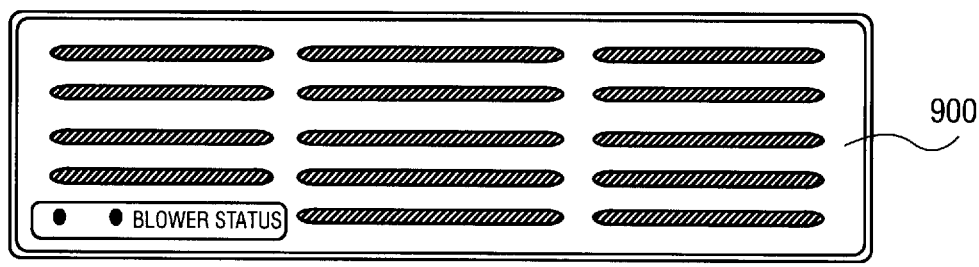
FIG. 9 is a perspective front view of the present invention with dual brushless DC blowers.

FIGS. 4, 6, and 8 illustrate various blower configurations of the computer peripheral bay cooling apparatus 200. For example, FIG. 4 shows the apparatus 200 from a top perspective outfitted with a single brushless DC blower 420. FIG. 6 shows the apparatus 200 from a top perspective outfitted with a single tangential crossflow blower 620. Finally, FIG. 8 illustrates the apparatus 200 from a top perspective outfitted with dual brushless DC blowers 820. FIGS. 5, 7, and 8 illustrate varying front panel configurations 500, 700, 900 for the peripheral bay cooling apparatus 200. As stated above, in a preferred embodiment the front panels 500, 700, 900 will be made of plastic and will be color-matched to the color schemes of typical OEM computer cases. It should be noted that FIGS. 4 through 9 are for purposes of illustration of various embodiments. One of ordinary skill in the art will readily recognize that alternative blower configurations may be employed within the computer peripheral bay cooling apparatus 200 without departing from the underlying principles of the invention.

What is claimed is:

1. An apparatus comprising:
   a blower chassis to fit securely within an industry standard 5¼ inch device bay provided for a DVD or CD-ROM drive, the blower chassis substantially filling said 5¼ inch bay, the blower chassis installable using brackets and screws included in a computer system chassis;
   a blower enclosed within said blower chassis to provide air flow into a computer system to cool the contents of said computer system;
   a partition attached to said blower chassis to isolate external ambient air from ambient air within the computer system chassis to prevent re-circulation of heated air; and
   an industry standard disk drive power connector to provide power to the blower.

2. The apparatus of claim 1, wherein said blower enclosed within said blower chassis comprises a brushless direct current (DC) blower.

3. The apparatus of claim 1, further comprising a second brushless DC blower.

4. The apparatus of claim 1, wherein said blower enclosed within said blower chassis comprises a tangential crossflow blower.

5. The apparatus of claim 1, wherein said blower comprises a thermally controlled blower to increase air flow when more cooling is required and to decrease airflow when less cooling is required.

6. The apparatus of claim 5, wherein said blower comprises a thermally controlled blower utilizing local speed sensing circuitry.

7. The apparatus of claim 5, wherein said blower comprises a thermally controlled blower utilizing remote speed sensing circuitry.

8. The apparatus of claim 7, wherein said remote speed sensing circuitry comprises a remote speed sensing circuitry located on a personal computer motherboard.

9. The apparatus of claim 1 further comprising acoustical foam disposed between said blower chassis and said drive bay.

10. A computer system comprising:
   a memory;
   a system bus;
   an industry standard 5¼ inch drive bay provided for a DVD or CD-ROM drive;
   a blower chassis to fit securely within said drive bay substantially filling said 5¼ inch drive bay, the blower chassis installable using brackets and screws included in a computer system chassis;
   a blower enclosed within said blower chassis to provide air flow into the computer system chassis to cool the contents of said computer system chassis, the blower including an industry standard disk drive power connector for providing power to said blower; and
   a partition attached to said blower chassis to isolate external ambient air from ambient air within the computer system chassis to prevent re-circulation of heated air.

11. The computer system of claim 10, wherein said blower enclosed within said blower chassis comprises a brushless direct current (DC) blower.

12. The computer system of claim 11 further comprising a second brushless DC blower.

13. The computer system of claim 10, wherein said blower enclosed within said blower chassis comprises a tangential crossflow blower.

14. The computer system of claim 10, wherein said blower comprises a thermally controlled blower to increase air flow when more cooling is required and to decrease airflow when less cooling is required.

15. The computer system of claim 14, wherein said blower comprises a thermally controlled blower utilizing remote sensing circuitry.

16. The computer system of claim 15, wherein said remote speed sensing circuitry is disposed on a personal computer motherboard.

17. The computer system of claim 10, wherein said blower comprises a controlled blower utilizing local speed sensing circuitry.

18. The computer system of claim 10 further comprising acoustical foam inserted between said blower chassis and said 5¼ inch bay.

19. An apparatus comprising:
   a blower chassis to fit securely within a peripheral bay, the blower chassis substantially filling the peripheral bay;
   a blower enclosed within the blower chassis to provide air flow into a computer system to cool contents of the computer system, the blower controlled by thermal sensing elements placed at various locations within a computer system chassis; and
   a partition attached to the blower chassis to isolate external ambient air from ambient air within the computer system chassis to prevent re-circulation of heated air.

20. The apparatus of claim 19, wherein the blower enclosed within the blower chassis comprises a brushless direct current (DC) blower.

21. The apparatus of claim 19, further comprising a second brushless DC blower.

22. The apparatus of claim 19, wherein the blower enclosed within the blower chassis comprises a tangential crossflow blower.

23. The apparatus of claim 19, wherein the blower comprises a thermally controlled blower to increase air flow when more cooling is required and to decrease airflow when less cooling is required.

24. The apparatus of claim 19, wherein the blower comprises a thermally controlled blower utilizing local speed sensing circuitry.

25. The apparatus of claim 19, wherein the remote sensing circuitry comprises a remote speed sensing circuitry located on a personal computer motherboard.

26. The apparatus of claim 19, further comprising acoustical foam disposed between the blower chassis and the peripheral bay.

27. The apparatus of claim 19, wherein the blower is installable within the computer system chassis using brackets and screws included in the computer system chassis.

* * * * *